United States Patent [19]

Tuominen

[11] Patent Number: 5,051,136
[45] Date of Patent: Sep. 24, 1991

[54] PROCEDURE FOR WASHING CIRCUIT BOARDS AND MEANS FOR USE IN SAID PROCEDURE

[75] Inventor: Aulis Tuominen, Salo, Finland

[73] Assignee: Nokia Mobile Phones Ltd., Salo, Finland

[21] Appl. No.: 473,908

[22] Filed: Jan. 31, 1990

[30] Foreign Application Priority Data

Feb. 2, 1989 [FI] Finland .................................. 890507

[51] Int. Cl.$^5$ ............................ B08B 1/02; B08B 3/02
[52] U.S. Cl. ..................................... 134/15; 134/25.4;
134/30; 134/31; 134/32; 134/37; 134/38;
134/72; 134/67; 134/130; 134/151; 134/152;
134/184; 15/303; 15/306.1; 15/309.1; 15/309.2
[58] Field of Search ................. 134/15, 25.41, 32, 38,
134/37, 72, 130, 67, 151, 152, 184, 30, 31;
15/303, 306 R, 306 A, 306 B

[56] References Cited

U.S. PATENT DOCUMENTS

| | | | |
|---|---|---|---|
| 3,289,238 | 12/1966 | Sorenson et al. | 15/306 R |
| 4,313,451 | 2/1982 | Vilen | 134/72 |
| 4,366,005 | 12/1982 | Oquri et al. | 134/30 |
| 4,589,926 | 5/1986 | Holmstrand | 134/25.4 |

OTHER PUBLICATIONS

The Electronics Assembly Handbook, pp. 324–326, first published in Electronic Packaging & Production, Aug. 1984—Author: Carmen A. Capillo, ECR Corp.

Primary Examiner—Theodore Morris
Assistant Examiner—Zeinab El-Arini
Attorney, Agent, or Firm—Darby & Darby

[57] ABSTRACT

The present invention concerns a procuedure for washing off flux residues subsequent to soldering from a circuit board or equivalent component. The circuit board washing procedures of prior art have either been detrimental to the environment or poor in their washing result. These problems have in the present invention been solved by including at least one step in the procedure in which steam is sprayed on the circuit board or equivalent. The steam spraying step is advantageously combined with preceding water washing and rinsing steps. A circuit board or equivalent component rinsed with hot steam is recovered in a cleaner condition than before, and moreover, entirely dry.

16 Claims, 1 Drawing Sheet

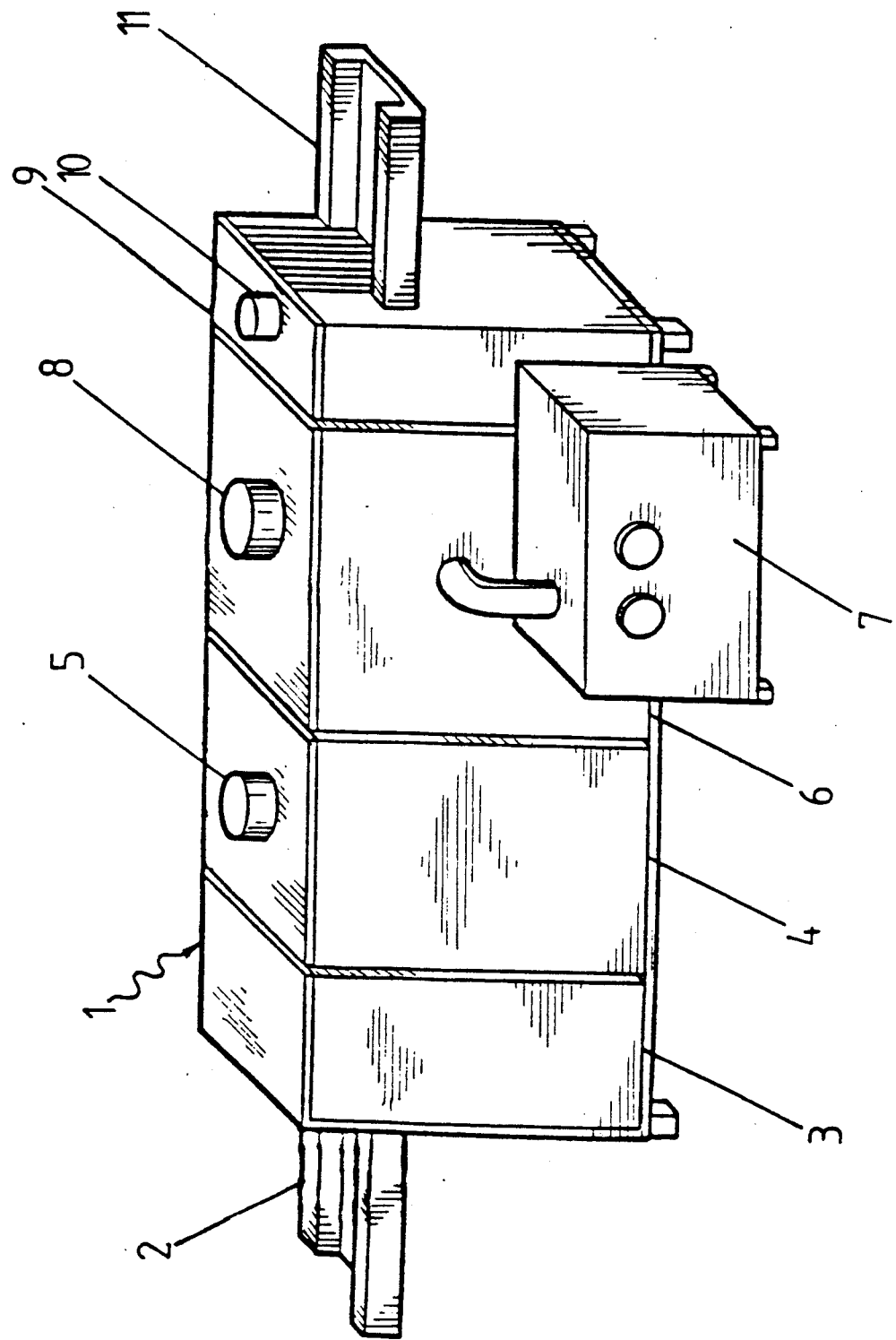

PROCEDURE FOR WASHING CIRCUIT BOARDS AND MEANS FOR USE IN SAID PROCEDURE

The present invention concerns a procedure for washing off flux residues after soldering from a circuit board or an equivalent component on which said soldering has been made. The invention also concerns a means for carrying out said washing procedure.

When high-active or active and smearing fluxes are used in soldering circuit boards, the circuit boards need a careful washing after being soldered. This requirement is supported not only by cosmetic aspects but also the requirements of the test results implying the properties of the circuit board. The problem is greatest when flux remains on high-impedance boards which in their use are subjected to continuous thermal variations causing corrosion. No needle bed testing can be done in the production process without washing.

Flux residues have traditionally been washed off from the circuit board with freon-based solvents which are chlorine fluorine hydrocarbons possessing an extremely great solving capacity.

For these solvent washing systems, which are expensive and detrimental both for man and environment, e.g. causing ozone losses, endeavours have been made for a long time to find some replacement. An important alternative is washing with water in which water washable fluxes are either directly used or original solvent-washable fluxes are used, these being first treated with certain alkaline agents with which the fluxes are 'saponified'.

An advantage of the water washing has been thought to be better soldering results, which are due to the higher activity of the fluxes, and a higher purity which may be even manifold in comparison with the solvent cleaning systems. The purity is due to the easy dissolution of water washable fluxes in water, and on the other hand, water, which is inexpensive, can freely be consumed for rinsing in great quantities.

Water washing, which in other respects is very useful, is, however, subject to two problems: moisture remains inside the components after water washing, and from the narrow spaces between the components, flux residues often remain unremoved. Said drawbacks are due to the fact that water has a greater surface tension than the conventional solvents. Endeavours have been made to solve the problem by reducing the surface tension of water by means of expensive distillation and ion exchange systems. This has not, however, turned out to be economical.

The object of the present invention is therefore to provide a washing procedure for circuit boards or equivalent components, which at the same time is efficient and inexpensive. With the present invention attempts are also made to create an environmentally acceptable washing process. In addition, the object of the invention is to produce an as efficient and inexpensive washing means as possible for washing circuit boards and equivalent components.

The above objects have been achieved with a new procedure and a means which are mainly characterized in what is presented in the characteristic clause of respective claims 1 and 6. Thus, it is taught that the washing result is considerably better than before but not more expensive, when the washing contains at least one step in which steam is sprayed on the circuit board or equivalent component.

The steam jet step of the invention can be used as such for washing off flux residues from the circuit board or an equivalent component. It can also be combined with any known washing process of circuit boards or equivalent as an extra or optional process step.

According to a preferable embodiment, the steam jet step constitutes an essential part of the water washing process. This kind of process comprises, in addition to the steam jet phase, at least one of the following steps:

the circuit board or an equivalent component is washed with water, advantageously in a closed space either after pretreatment with a detergent or in the presence of a detergent, the circuit board or an equivalent component is rinsed by showering water thereon, this being advantageously heated. The above steps in general precede said steam jet step, and finally the circuit board or equivalent component is allowed to dry and cool.

This type of water-and-steam-washing method is advantageously a so-called in-line process in which the circuit board or equivalent component to be washed is transported e.g. with a belt through the zones performing the above, in series connected steps.

The steam jet step of the cleaning process including water washing steps is preferably accomplished with water vapour which is at such a pressure and temperature that it also eliminates substantially all moisture from the circuit board or equivalent component in addition to the impurities. A slightly pressurized vapour is completely gaseous and will efficiently turn the water drops remaining on the circuit board or equivalent into gaseous form.

The steam jet step is in general carried out by vaporizing water, by conducting the steam thus produced into nozzles positioned in a steam chamber from which it is from many directions sprayed towards the circuit board or equivalent located in the steam chamber. By maintaining the steam chamber at a small overpressure the steam can be let out of the chamber directly into the air or, if desired, through a condenser into a sewer.

The means of the invention comprises, in order to wash off the flux residues subsequent to the soldering from a circuit or an equivalent component, at least a zone in which steam is sprayed on the circuit board or equivalent. The zone consists advantageously of a steam producing means, feed members for feeding steam into jet ejecting nozzles designed for said purpose, jet ejecting nozzles being directed towards the circuit board from different directions, and of steam chamber walls therearound with apertures for feeding the circuit board or equivalent into the steam chamber and out of it. The steam chamber is also provided with an outlet aperture for discharging steam, and is on the outside of said chamber optionally provided with a condenser for condensing the steam discharged from the chamber.

The means comprises also preferably a closed washing space with requisite transport and washing members and washing water feed and outlet, a rinsing zone with rinsing liquid supply, spraying members and discharge. The washing space and the rinsing zone are placed before said steam spraying zone.

After the steam spraying zone is preferably disposed a drying and cooling zone with dry air feed and discharge, Said zones, that is, the closed washing space, the rinsing space, the steam spraying zone and the drying and cooling zone have advantageously been disposed one after the other and surrounded with an intact outer wall but separated with inner walls from one another to produce an in-line-process apparatus through which a circuit board or equivalent component to be washed is transported e.g. on a belt conveyor.

The invention is illustrated in the following with the aid of a figure presenting a perspective image in principle of the in-line-washing means of a circuit board or equivalent components.

A circuit board or equivalent is fed into a washing means 1 through a loading projection 2 located on the left in the figure, wherefrom a conveyor belt carries the piece to a first washing zone 3. The washing zone 3 is advantageously so closed that detergent can be added in the washing step for providing a better washing result, and on the other hand, water can be saved to reduce environmental loading. After the first water washing step the conveyor belt conveys the circuit board through a hole in the partition to the next zone 4 of the washing apparatus, in which a shower rinsing is so carried out on the circuit board that hot water is sprayed towards the circuit board. An outlet pipe 5 for discharging water vapour is also shown in the figure.

The last washing step which is accomplished in the steam chamber 6 is totally deviating from the conventional washing steps. With a small steam producing means 7, such as is used in industry, water vapour is produced, the heat content of which, that is, temperature and pressure, is keeping it in steam form during the entire period, and it will in no phase turn into water drops. In the steam chamber 6 steam is sprayed on the circuit board from all sides so that the reaction forces are not able to move the circuit board progressing on the conveyor belt. The conveyor belt is advantageously a metal mesh belt. In the steam chamber 6 prevails a slight overpressure which then is discharged out of an outlet pipe 8 positioned above the unit, e.g. out through a condenser (not shown) and into a sewer.

The last step is a drying and cooling unit 9 operating merely by suction principle. No separate driers are needed for the hot aqueous gas has removed all moisture from the circuit board. The drying air exits through the aperture 10 and the washed circuit board from the discharge projection 11.

Since the end washing is always done with hot steam, the water used in earlier washing steps need not be distilled or purified with ion exchange. The advantages of the new procedure and the new means of the invention are as follows.

They are less expensive than the earlier ones,
the means is smaller and more practical than earlier,
the operating costs are lower,
a totally dry washing result is obtained therewith,
steam penetrates more efficiently into the narrow spaces of the circuit board or equivalent component and gives a better washing result,
the kinetic energy removes small particles,
the steam used in the procedure has a better dissolving ability,
the water used at the initial step need not be purified by distilling or ion exchange,
the procedure is environmentally acceptable; it generates no freone affecting the ozone layer, nor great quantities of flux-polluted water,
they are faster than before, etc.

I claim:

1. A method for cleaning a circuit board, comprising the step of:
removing from the circuit board flux residues, which form on the circuit board from soldering on the circuit board, by spraying aqueous steam on the circuit board.

2. A method as in claim 11, further comprising the step of:
eliminating substantially all moisture from the circuit board with the steam by providing the steam with a heat content at a temperature and a pressure that transforms the moisture into gaseous form during the spraying of the steam on the circuit board.

3. A method as in claim 11, further comprising the steps of
vaporizing water to produce the steam, the removing step including spraying the steam through nozzles in a chamber so as to spray the steam from several directions via the nozzles onto the circuit board; and
maintaining the chamber under an overpressure for discharging the steam out of the chamber.

4. A method as in claim 3, further comprising the step of:
condensing the steam which is discharged.

5. A method as in claim 3, further comprising the step of:
introducing directly into the atmosphere the steam which is discharged.

6. A method as in claim 11, further comprising the steps of:
washing the circuit board with water;
rinsing the circuit board by spraying water thereon before the removing step; and
drying and cooling the circuit board after the removing step.

7. A method as in claim 6, wherein the step of washing takes place in the presence of a detergent.

8. A method as in claim 11, wherein each of the steps takes place in a respective zone, further comprising the step of:
conveying the circuit board in line through each of the zones in series.

9. An apparatus for cleaning a circuit board, comprising:
means for holding a circuit board that has flux residues which form on the circuit board from soldering on the circuit board; and
means for removing the flux residues from the circuit board, said removing means including means for spraying aqueous steam on the circuit board to remove the flux residues as the circuit board is being held by said holding means.

10. An apparatus as in claim 9, further comprising means for eliminating substantially all moisture from the circuit board with the steam by providing the steam with a heat content at a temperature and a pressure that transforms the moisture into gaseous form during the spraying of the steam on the circuit board.

11. An apparatus as in claim 9, further comprising means for vaporizing water to produce the steam, said removing means including means for guiding the steam to be sprayed through nozzles in a chamber so as to spray the steam from several directions via the nozzles onto the circuit board; and
means for maintaining the chamber under an overpressure for discharging the steam out of the chamber.

12. An apparatus as in claim 11, further comprising means for condensing the steam which is discharged.

13. An apparatus as in claim 11, further comprising means for introducing directly into the atmosphere the steam which is discharged.

14. An apparatus as in claim 9, further comprising means for washing the circuit board with water upstream of said washing means;
   rinsing the circuit board by spraying water thereon before the removing step; and
   drying and cooling the circuit board after the removing step.

15. An apparatus as in claim 14, wherein each of said means is in a respective zone, further comprising:
   means for conveying the circuit board in line through each of the zones in series.

16. An apparatus as in claim 9, further comprising the circuit board with flux residues, said holding means holding said circuit board.

* * * * *

UNITED STATES PATENT AND TRADEMARK OFFICE
CERTIFICATE OF CORRECTION

PATENT NO. : 5,051,136
DATED : September 24, 1991
INVENTOR(S) : Aulis Tuominen

It is certified that error appears in the above-indentified patent and that said Letters Patent is hereby corrected as shown below:

Claim 2, line 1: "11" should be —1—.

Claim 3, line 1: "11" should be —1—.

Claim 6, line 1: "11" should be —1—.

Claim 8, line 1: "11" should be —1—.

Signed and Sealed this

Third Day of October, 1995

*Attest:*

BRUCE LEHMAN

*Attesting Officer*     *Commissioner of Patents and Trademarks*